United States Patent [19]

Kenney

[11] Patent Number: 5,719,080
[45] Date of Patent: Feb. 17, 1998

[54] SEMICONDUCTOR TRENCH CAPACITOR CELL HAVING A BURIED STRAP

[75] Inventor: Donald M. Kenney, Shelburne, Vt.

[73] Assignee: International Business Machines Corporation, Armonk, N.Y.

[21] Appl. No.: 522,204

[22] Filed: Aug. 31, 1995

Related U.S. Application Data

[62] Division of Ser. No. 421,714, Apr. 13, 1995, Pat. No. 5,576,566.

[51] Int. Cl.$^6$ .................................................. H01L 21/8242
[52] U.S. Cl. .................................................. 438/243; 438/386
[58] Field of Search ............................. 437/47, 48, 52, 437/60, 203, 919

[56] References Cited

U.S. PATENT DOCUMENTS

| | | | |
|---|---|---|---|
| 4,965,217 | 10/1990 | Desilets et al. | 437/203 |
| 5,384,277 | 1/1995 | Hsu et al. | 437/60 |
| 5,389,559 | 2/1995 | Hsieh et al. | 437/919 |
| 5,545,583 | 8/1996 | Lam et al. | 437/60 |

*Primary Examiner*—Charles L. Bowers, Jr.
*Assistant Examiner*—Toniae M. Thomas
*Attorney, Agent, or Firm*—Heslin & Rothenberg, P.C.

[57] ABSTRACT

A semiconductor trench capacitor structure having a first level aligned isolation structure and buried strap that extends from within the trench into the doped semiconductor substrate. The semiconductor trench capacitor structure may be fabricated by forming a shallow trench within the trench capacitor and semiconductor substrate, depositing a layer of conductive material within the shallow trench, using a mask to define and recess the strap and depositing insulating material within the shallow trench.

12 Claims, 5 Drawing Sheets

SEMICONDUCTOR TRENCH CAPACITOR CELL HAVING A BURIED STRAP

This application is a division of Ser. No. 08/421,714 filed on Apr. 13, 1994, now U.S. Pat. No. 5,576,566.

FIELD OF THE INVENTION

The present invention relates to a semiconductor trench capacitor cell having a buried strap. More particularly, the present invention relates to a process for fabricating a semiconductor trench capacitor cell with a first level aligned buried strap.

BACKGROUND OF THE INVENTION

Due to the extensive use and broad range of applications of integrated circuits a wide variety of semiconductor memory devices have been developed. These semiconductor memory devices are continuously being applied to new and expanding uses, which in turn require an integrated circuit of increased capabilities and decreased cost. Accordingly, there exists a continuing demand for inexpensive semiconductor devices having increased memory and reduced chip size. Improvements of this nature have been realized in device miniaturization and improved layout and design of semiconductor memory devices.

Many prior art devices utilize recessed oxide (ROX) isolation trenches to separate adjacent trench capacitor cells as a means for preventing electrical interferences (i.e. due to leakage from the channel region of the adjacent memory cell) and parasitic device formation between the trench capacitor and the edge of an active semiconductor region abutting the trench capacitor. Accordingly, when utilizing designs or structures incorporating the ROX isolation trenches, there is a minimum distance (the length of the ROX trench) which must be maintained between the memory cell capacitor and gate electrode of adjacent memory cells in order to avoid electrical interferences and parasitic device formation between the two components. However, the semiconductor substrate area occupied by the ROX isolation trenches is considerable. Thus, a semiconductor device design which avoids or minimizes the use of ROX isolation trenches allows a more densely packed memory array and is, therefore, preferred.

In addition, many memory devices, such as DRAM cells, utilize a dynamic memory cell wherein a bit is represented by a charge stored in a capacitor structure. In DRAM cells the capacitor structure must be coupled with the storage node of the FET. However, due to the already high density of existing semiconductor devices little room is available for surface straps. Moreover, due to the high device density and minimum feature size it is necessary for processing sequences to be compatible with an ever increasing range of structures and materials. For example, contacts are generally formed by etching contact holes in a passivation layer over the areas where the contacts are to be made, followed by depositing a conductive material therein. However, due to the topology of the semiconductor device, formation of the contact holes may often cause damage to other surface structures, such as gate conductors (word lines), or to the passivation layers themselves. It is, therefore, often preferred to provide a buried strap for connecting various regions of the semiconductor device. First, since the strap is buried it leaves more room on the surface of the semiconductor device and, thus, facilitates realization of even higher device densities. Secondly, since the strap contacts are formed at the front end of the integrated process (i.e. prior to formation of many structures) potential damage to other surface structures is obviated.

There exists a continuing demand for semiconductor memory device designs and processes which utilize fewer processing sequences, while at the same time facilitating greater storage capacity and allowing more densely packed memory arrays. There further exists a need for a trench capacitor structure having a buried strap and isolation structure, both of which are aligned with the trench capacitor structure.

SUMMARY OF THE INVENTION

A process for producing a semiconductor device having a buried strap, comprising:
- a semiconductor substrate;
- a first trench extending into said substrate, said trench having a first insulating portion with a conductive material situated therein;
- a doped region adjacent said trench; and
- a second trench extending into said doped region and partially intersecting said first trench, said second trench having a first conductive portion adjacent both said conductive material within said first trench and said doped region, said second trench having a second insulation portion at least partially filling said second trench and positioned over and adjacent said first conductive portion of said second trench.

In a further aspect, the invention relates to a method of producing a semiconductor device having a buried strap, comprising:
- forming a first trench in a semiconductor substrate, said first trench having an insulation layer with a conductive material situated therein;
- forming a second trench within said first trench and extending into said semiconductor substrate;
- forming a layer of conductive material within said second trench wherein the conductive material lies below the surface of the semiconductor substrate;
- depositing a protective layer over a contiguous portion of the conductive material within said second trench, wherein said contiguous portion of the conductive material extends over said first trench and said semiconductor substrate and defines a buried strap;
- recessing the exposed portions of said second trench below the depth of said buried strap;
- removing said protective layer;
- forming an insulation region within said second trench; and
- forming an insulation layer over the conductive material within said first trench.

In a further aspect, the method may further comprise forming a dielectric material over said silicon substrate prior to forming said first trench. In a further aspect of the invention, the method may be further characterized by a first trench which is defined by an interior wall having an upper and lower portion and wherein forming an insulation layer on the interior of said trench comprises:
- forming a thin insulation layer on the bottom portion of said interior wall; and
- forming a thick insulation layer on the top portion of said interior wall.

BRIEF DESCRIPTION OF THE DRAWINGS

FIGS. 2b–6b show cross-sectional views taken at A—A[1] of a structure created in the fabrication of the trench capacitor cell shown in FIG. 1a and 1b.

DESCRIPTION OF THE PREFERRED EMBODIMENT

Figure 1A:
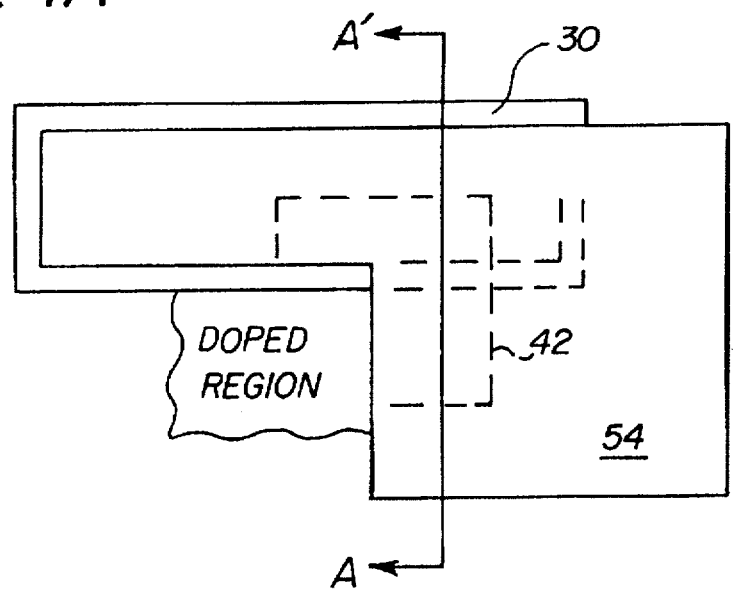
FIG. 1a shows a top view of a trench capacitor cell of the present invention with a buried strap shown in shadow.
Figure 1B:
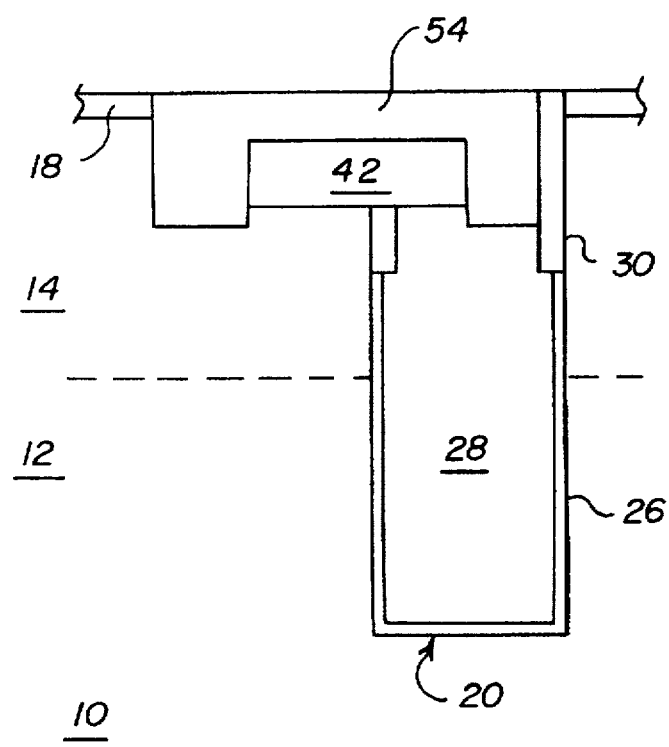
FIG. 1b shows a cross-sectional view of the trench capacitor cell of FIG. 1a taken at A—A[1].

The semiconductor memory device of the present invention, an embodiment of which may be seen in reference FIGS. 1a and 1b, may be formed in a composite semiconductor substrate 10 having an N-well 14 formed above a P+ substrate region 12. The semiconductor memory device having a trench capacitor comprising a deep trench 20 having a conductive material fill 28, a thin insulation layer 26 and sidewall defined thick isolation layers 30. The contiguous layer of conductive material 42 forming the buried strap extends from within the deep trench 20 into an active region of the semiconductor substrate 10, thereby coupling the conductive fill 28 of the trench capacitor with the storage node of the FET. A second isolation layer 54 extends over both the conductive material fill 28 within the deep trench and over the top of and at least one side of the buried strap 42.

It should be noted that throughout this specification various aspects of the invention have been shown and schematically represented in a simplified manner in order to more clearly describe and show the present invention. For example, the top views and vertical cross-sections of the trench constructions in the present application have been illustrated as being geometrically shaped, specifically rectangular in shape. However, one skilled in the art will appreciate that with practical semiconductor methods the actual formation of the trench will most likely incorporate more rounded features. Moreover, the scope of the present invention is not intended to be limited to constructions of any particular shape.

Figure 2B:
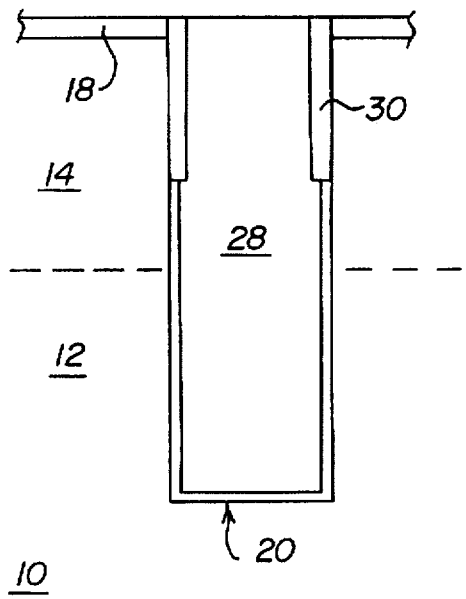
Figure 3A:
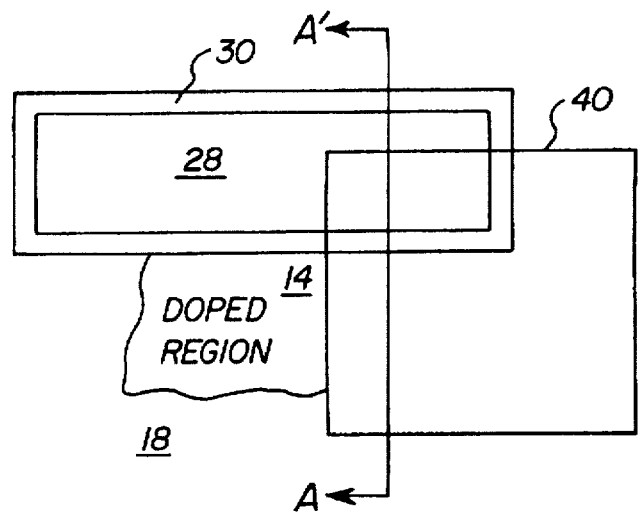
FIGS. 3a and 6a show top views of a structure created in the fabrication of the trench capacitor cell shown in FIG. 1a and 1b and correspond to FIGS. 3b and 6b respectively.
Figure 3B:
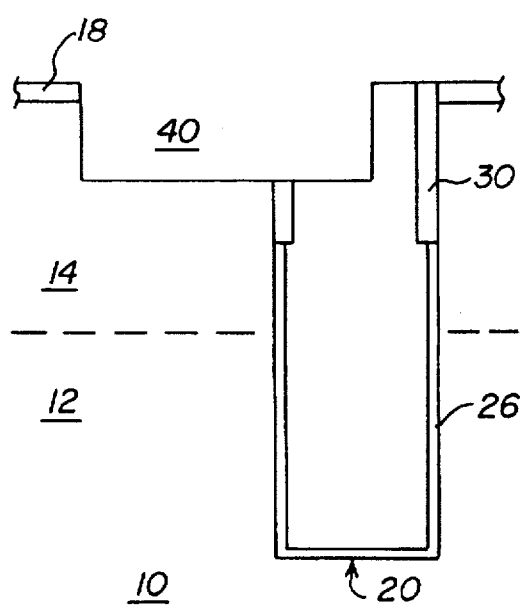
Figure 4B:
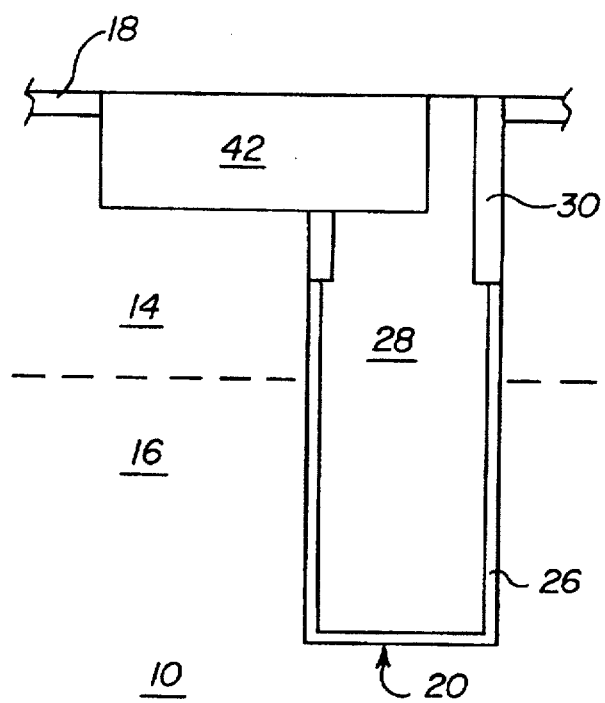
Figure 5B:
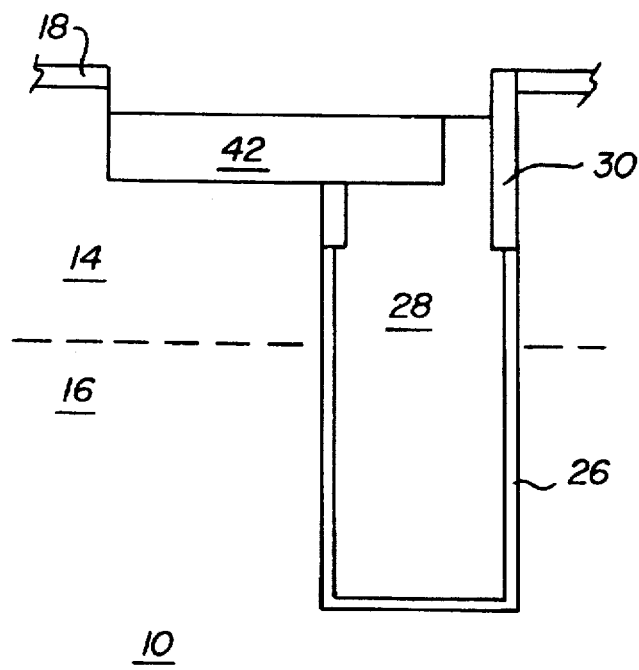

As may be seen in reference to FIGS. 2b–6b, 3a and 6a, illustrations are shown depicting intermediate structures which may be created during fabrication of a semiconductor memory device of the present invention. A semiconductor substrate 10, such as a composite semiconductor substrate is shown in FIG. 2b, having an N-well 14 formed above a P+ substrate 12. One skilled in the art will recognize that the positioning and configuration of the respective doped regions will vary with the particular design of the semiconductor device and alternate designs are intended to be encompassed by the present invention. A surface dielectric layer 18 may then be formed conformally over the surface of the semiconductor substrate. This dielectric layer may be formed by any one of several known methods, for example, oxidation growth or chemical vapor deposition. The thin surface dielectric layer over the semiconductor substrate is shown systematically as a single thin insulation layer. However, in a preferred embodiment this insulation layer comprises a composite of dielectric materials, such as a silicon oxide layer and a silicon nitride layer. More preferably, a first silicon oxide layer of approximately 100 Å and a second layer of silicon nitride of approximately 1000 Å over the oxide.

A masking oxide layer (not shown) may be formed on top of the surface dielectric layer 18 and patterned to allow a deep trench 20 to be formed down into the semiconductor substrate. The deep trench may be formed via methods well known in the art, for example, reactive ion etching (RIE). As may still be seen in reference to FIG. 2b, the trench 20 may be defined by a bottom wall, and a sidewall having an upper sidewall portion and a lower sidewall portion. The upper sidewall portion preferably has a thick isolating layer 30 and the lower sidewall portion a thin insulating layer 26. In a preferred embodiment the upper sidewall portion occupies approximately 10 to 20 percent of the sidewalls, and the lower sidewall portion occupies approximately the lower 80 to 90 percent of the sidewalls. However, it should be noted that these percentages are only exemplary, the present invention being useful with other sidewall arrangements.

After forming the deep trench 20 the thin insulating layer 26 may be formed along the trench sidewalls by methods well known in the art, examples including thermal oxide growth or chemical vapor deposition. Preferably the thin insulating layer has a thickness of 5 to 10 nM. This insulating layer may comprise of common insulating materials, examples including silicon oxide, silicon nitride and preferably combinations thereof. The deep trench 20 may then be filled with a conductive material 28, an example being a P+ doped polysilicon such as boron-doped polysilicon, which facilitates the storage of a charge in a trench capacitor structure.

Thereafter, a portion of the conductive material 28 may be removed from the deep trench 20 in order to expose the upper portion of the trench sidewalls. The point at which the removal is terminated will define the upper and lower trench side wall portions. In a preferred embodiment the polysilicon fill would be left in the lower 80% of the trench. After a portion of the conductive fill 28 has been removed and the upper portions of the trench sidewalls exposed, thick isolating layers 30 may be formed along the trench upper sidewall. These thick isolating layers may be formed by chemical vapor deposition, thermal oxide growth or other means which allows a conformal layer of an insulation material to be applied to the sidewalls. An anisotropic etch (e.g. RIE) may be applied to remove portions of the oxide without removing those portions formed on the sidewalls of the trench. The thick isolating layers may comprise common dielectrics similar to those utilized by the thin insulating layer discussed herein above. In a preferred embodiment, the thick isolating layers formed along the trench upper sidewall portions have a thickness of about 50 to 100 nM. However, the thick isolating layers and the process of forming the same may be omitted if the depth of the recess areas 52 (see FIG. 6B) is sufficiently deep to prevent parasitic device formation as discussed hereinbelow.

Thereafter, a second deposition of conductive fill material 28, such as boron doped polysilicon, may be deposited in the upper portion of the trench adjacent the newly formed thick isolating layers 30. Thereafter, the newly deposited conductive fill 28 may be planarized to form an even plane with the surface dielectric, this may be accomplished by means well known in the art such as by chemical mechanical polishing or RIE. The cross section of the resulting structure may be seen with reference to FIG. 2b.

A photolithographic mask (not shown) may be applied, exposed and developed in order to leave exposed a contiguous region overlying a portion of both the deep trench 20 and the adjacent semiconductor region 10. The exposed region may be etched back, such as by RIE (reactive ion etching), thereby forming a shallow trench 40, as may be seen with reference to FIGS. 3a and 3b. A preferred etch used to create the isolation trench is one using $CF_4/O_2$ chemistries that etches non-selectively between silicon oxide and silicon. Preferably, the shallow trench 40 extends to a depth of approximately the top 5 to 10 percent of the sidewalls and does not extend below either the N-well region 14 or the thick isolating layers 30. After depositing and planarizing the undoped polysilicon 42 within the shallow trench 40 the photolithographic mask (not shown) is removed. It is preferred that the mask be removed prior to deposition of the polysilicon since such masks typically cannot withstand such deposition temperatures.

A conductive material 42, an example being undoped polysilicon, may then be deposited within the shallow trench 40 and planarized to remove excess undoped polysilicon and to form an even surface with the dielectric layer. The resulting structure may be seen in FIG. 4b. In reference to FIG. 5b, both the doped polysilicon 28 of the deep trench 20 and the undoped polysilicon 42 of the shallow trench 40 may then be recessed below the surface of the semiconductor substrate 10 in order to leave a contiguous layer of the undoped polysilicon 42 in the lower portion of the shallow trench 40. Preferably, the doped polysilicon in the deep trench and the undoped polysilicon in the shallow trench are both etched back to a depth which leaves a layer of undoped polysilicon having a thickness of about 100 nM. In addition, it should be noted that upon heating dopants from the doped semiconductor region 14 substrate and/or the conductive fill 28 of the deep trench will diffuse into the strap 42 making it conductive.

It is preferred that the process utilized to recess the exposed silicon materials be accomplished with a process that selectively recesses the silicon relative to the surface dielectric layer 18. Such a selective process may include use of an etch that selectively etches silicon (doped and undoped) relative to the surface dielectric layer. In this regard, the surface dielectric layer 18 would act as an etch stop. For example, when the thin surface dielectric layer comprises a thick layer of silicon nitride over a thin layer of silicon oxide a selective polysilicon:nitride etch may be used. Such etches are well known in the art, an example of such an etch is described in the article Nguyen et al. "Substrate Trenching Mechanism During Plasma and Magnetically Enhanced Polysilicon Etching", *Journal of Electrochemical Society*, Vol. 138 No. 4 ppg. 1112–1117 (April 1991), the contents of which are incorporated herein by reference. It will be understood that during this procedure, even when using an etch that selectively etches the polysilicon relative to the surface dielectric layer, a portion of the surface dielectric layer will be consumed in the process. Thus, depending on the selectivity of the particular etch, or other selective process, the amount of the surface dielectric layer which may be consumed will vary. Therefore, the desired thickness of the surface dielectric layer will vary accordingly. The surface dielectric layer should be of a thickness such that the processing will not reduce the thickness of the surface dielectric layer to an extent which allows etching or damage to the underlying semiconductor substrate and electronic elements therein. Utilizing a surface dielectric layer having a thickness of about 100 to 150 nM generally provides an acceptable assurance that the surface dielectric layer will prevent unwanted etching or damage to the areas under the surface dielectric layer.

Figure 6A:
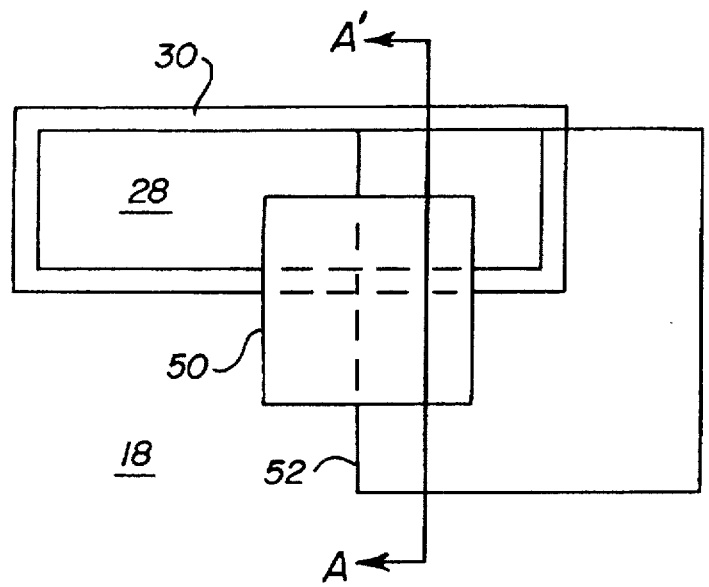
Figure 6B:
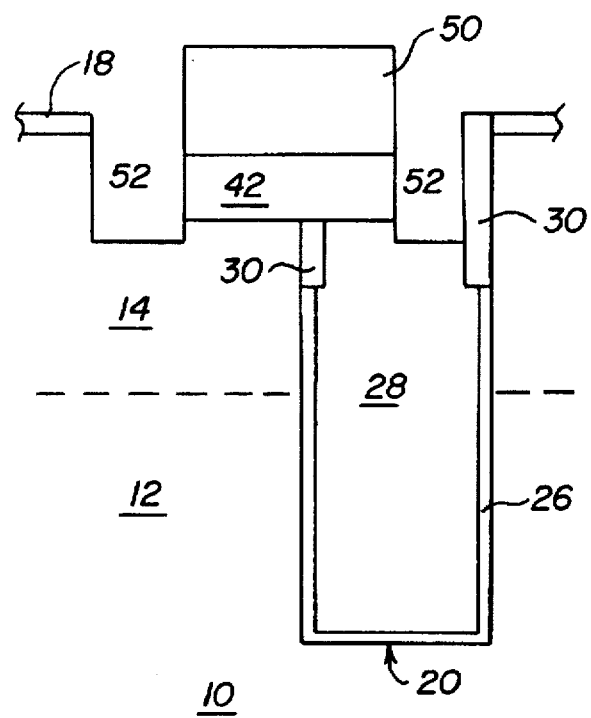

As may be seen with reference to FIGS. 6a and 6b, a resist 50 may be applied over the semiconductor device, exposed and developed to leave a portion of the resist 50 relative to the shallow trench 40 and such that the resist 50 upon the conductive material 42 extends over the semiconductor substrate 10, the thick isolating layer 30 and conductive fill 28 of the deep trench 20. The resist 50 may also extend over limited portions of the deep trench 20 and the surface dielectric layer 18 outside the area defined by the shallow trench 40. The polysilicon regions of both the deep trench 20 and the shallow trench 40 which are left unmasked and exposed may then be recessed. It is again preferred that the polysilicon be selectively etched relative to the surface dielectric layer 18. The exposed polysilicon regions may be recessed to a depth beneath the original depth of the shallow trench 40, thereby forming an open recessed area 52. However, if recess area 52 is made sufficiently deep to prevent parasitic device formation, about 200 nM or more below original depth of trench 40, then it may not be necessary to have a thick oxide collar in the original deep trench as discussed above.

Thereafter, as may be seen with reference to FIG. 1a and 1b, the open recessed area 52 may be filled with an insulating material, thereby forming a second insulation layer 54. Examples of suitable insulation materials include, but are not limited to, silicon oxide, and silicon oxide/silicon nitride combinations. A preferred insulator may be formed by depositing TEOS (tetraethoxysilane) by chemical vapor deposition. Thereafter, the oxide may be densified, such as by thermal densification in an $N_2$ atmosphere. An oxidizing atmosphere may be preferred depending on the stress tolerable by the silicon structure. Thereafter, the insulating material may be planarized by means well known in the art so that the additional insulation forms an even plane with the surface dielectric layer. The undoped polysilicon 42 remaining within the shallow trench 40 forms a buried strap which is in contact with both the conductive fill of the trench capacitor and the storage node of the FET.

Figure 7:
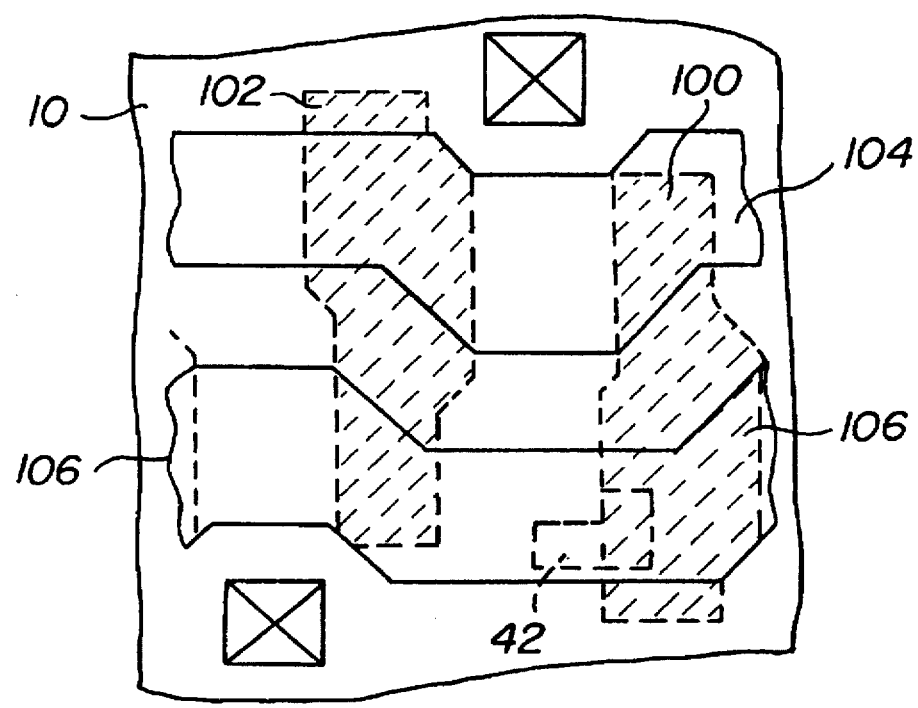
FIG. 7 is a top view of a portion of a semiconductor device showing a memory array design incorporating trench capacitor cells of the present invention.

As may be seen with reference to FIG. 7, utilizing trench capacitor cells of the present invention enables the array layout to eliminate many ROX regions. The capacitors 100 and 102 may be configured orthogonal to the word lines 104 and 106. The trench spacing may now be a function of defining a space for the source diffusion rather than ROX isolation trenches since the trench capacitors 100 and 102 may abut an active semiconductor region of an adjacent memory cell. The buried strap may extend from within the trench capacitor 100 into an active region of the semiconductor substrate, such as the storage node of a transistor. The transistor may be located under the active wordline 104 and opposite the end of the deep trench 100 housing the buried strap 42. The passing wordline 106 may extend over the buried strap which may be located at the end of the trench away from the active wordline 104.

As a result of the aforementioned embodiments of the present invention, a semiconductor trench capacitor cell is furnished having structures formed and first level aligned within the sidewalls of the deep trench. The tolerances associated with fabrication processes have been limited to one mask, namely the mask used to define the shallow trench. The remaining structures being self-aligned with the walls of the shallow trench. A buried strap is formed which extends within the area utilized by the deep trench and into the storage node of the FET. The insulation needed by the strap is similarly situated and defined, thus facilitating the construction of memory arrays which can be more densely packed. By forming an isolation structure of the present invention which is first level aligned to the trench sidewalls, extra chip space that was previously devoted to isolating the trench capacitor from the active semiconductor region of the adjacent memory cell is no longer needed.

While the invention has been particularly shown and described with reference to preferred embodiments thereof, it will be understood by those skilled in the art that other changes in form and details may be made therein without departing from the spirit and scope of the invention.

What is claimed is:

1. A process for producing a semiconductor device having a buried strap, comprising:

forming a first trench in a semiconductor substrate, said first trench having an insulation region with a conductive material situated therein;

forming a second trench in said first trench and extending into said semiconductor substrate;

forming a layer of conductive material within said second trench wherein the conductive material lies below the surface of the semiconductor substrate;

depositing a protective layer over a contiguous portion of the conductive material within said second trench, wherein said contiguous portion of the conductive material extends over said first trench and said semiconductor substrate and defines a buried strap;

recessing the exposed portions of said second trench below the depth of said buried strap;

removing said protective layer;

forming an insulation region within said second trench; and forming an insulation layer over the conductive material within said first trench.

2. The process of claim 1 further comprising forming a dielectric layer over said semiconductor substrate prior to forming said first trench.

3. The process of claim 2, wherein said dielectric layer is formed by first forming a layer of silicon oxide over said semiconductor substrate and then forming a layer of silicon nitride over said silicon oxide.

4. The process of claim 1 wherein said insulation layer comprises silicon oxide and wherein said process further comprises the step of densifying said insulation layer after forming said insulation layer.

5. The process of claim 1, wherein said first trench is defined by an interior wall having an upper and lower portion and wherein forming said first trench having said insulation region comprises:

forming a thin insulation layer on the lower portion of said interior wall; and forming a thick insulation layer on the upper portion of said interior wall.

6. The process of claim 1 wherein said conductive material deposited in said first trench comprises a p+ doped polysilicon.

7. The process of claim 6 wherein said conductive material deposited in said second trench comprises undoped polysilicon.

8. The process of claim 5 wherein prior to removing said protective layer the conductive material within said first trench is recessed.

9. The process of claim 2 wherein forming layer of conductive material within said second trench below the surface of said semiconductor substrate comprises:

depositing a conductive material within said second trench; and recessing said conductive material within said second trench below the surface of said semiconductor substrate.

10. The process of claim 9 further comprising recessing the conductive material within said first trench below the surface of said semiconductor substrate.

11. The process of claim 10 wherein said recessing of the conductive material within said second trench and said recessing of the conductive material within said first trench are performed simultaneously by application of an etch that selectively etches said conductive material relative to said dielectric layer.

12. The process of claim 10 wherein forming said insulation region within said second trench and forming an insulation layer over said first trench comprises simultaneously depositing an insulating material within said recessed portions of said first and second trenches.

* * * * *